United States Patent [19]

Harwood et al.

[11] 4,426,625
[45] Jan. 17, 1984

[54] CIRCUIT FOR LINEARLY GAIN CONTROLLING A DIFFERENTIAL AMPLIFIER

[75] Inventors: Leopold A. Harwood, Bridgewater, N.J.; Robert L. Shanley, II, Indianapolis, Ind.

[73] Assignee: RCA Corporation, New York, N.Y.

[21] Appl. No.: 296,865

[22] Filed: Aug. 27, 1981

[51] Int. Cl.³ .......................... H03F 3/45; H03G 3/30
[52] U.S. Cl. .................................... 330/254; 330/278
[58] Field of Search ..................... 330/254, 278, 261

[56] References Cited

U.S. PATENT DOCUMENTS 3,737,796  6/1973  Legler .................................. 330/285
3,940,708  2/1976  Sumi et al. .......................... 330/254
4,013,972  3/1977  Nishitoba et al. ................... 330/254

OTHER PUBLICATIONS

Rufray, J. C., "Monolithic Audio Power Amplifier with Volume and Tone Control" Conference.
International Conference on New Trends in I-C, Paris, France, Apr. 7-10, 1981.
Steckler, S. A., "Low Distortion Current Splitter/Attenuator" RCA Technical Notes, TN. No. 965, Jul. 2, 1974.

Primary Examiner—James B. Mullins
Assistant Examiner—Gene Wan
Attorney, Agent, or Firm—E. M. Whitacre; P. J. Rasmussen; R. H. Kurdyla

[57] ABSTRACT

A circuit for linearly controlling the gain of a differential amplifier includes a differentially connected current splitter network biased by means of a symmetrical bias circuit coupled to a common operating potential and including first and second current sources with associated first and second impedances. The current splitter includes a diode exhibiting a non-linear voltage in response to linear current conduction, and a transistor. The bias circuit responds to a variable gain control voltage for causing the diode to conduct current which varies linearly with the gain control voltage. First and second mutually differential control voltages derived from the transistor and diode, including a non-linearly varying voltage exhibited by the diode, are applied to the differential amplifier for controlling the conduction of the differential amplifier linearly with respect to the original control voltage.

9 Claims, 6 Drawing Figures

CIRCUIT FOR LINEARLY GAIN CONTROLLING A DIFFERENTIAL AMPLIFIER

This invention concerns a signal translating circuit for processing a variable amplitude gain control signal to produce a modified gain control signal for a differential amplifier such that the gain of the differential amplifier is caused to vary linearly with the original gain control signal.

Many signal processing systems require a differential amplifier, including an emitter-coupled transistor pair, which is gain controlled in response to a gain control signal. In such case it is often desirable to compensate for the inherently non-linear signal transfer response exhibited by the differential amplifier over a significant portion of its operating range between cut-off and full conduction states so that the gain of the differential amplifier varies linearly with respect to variations of the gain control signal. This result is particularly desirable in a television receiver signal processing system where the gain control signal is derived from viewer adjustable controls such as contrast or color saturation controls. In such case a viewer typically prefers to see a change in the contrast or color saturation level of the displayed picture which varies linearly with adjustment (i.e., rotation) of the contrast or color control. Such a linear relationship also facilitates fine adjustment of the picture contrast or color level when the extremes of the control range are approached, particularly when the controls (e.g., potentiometers) exhibit a linear taper as is commonly the case.

In accordance with the present invention, there is disclosed a signal translating circuit responsive to a variable gain control signal for providing a translated version of the variable gain control signal. The translated signal includes a nonlinear component such that, when the translated signal is applied to a differential amplifier, the differential amplifier conducts linearly with respect to the original variable gain control signal.

The operation of the signal translating circuit is undisturbed by the effects of loading by one or more differential amplifiers which are driven by the signal translating circuit. In addition, output signals from the signal translating circuit are not impaired by operating supply voltage variations (e.g., due to temperature variations), or by interference signals such as may appear on the operating supply voltage lines.

The signal translating circuit according to the invention includes a differentially connected current splitter network biased by means of a symmetrical bias circuit coupled to a common operating potential and including first and second current sources with associated first and second impedances. The current splitter includes a semiconductor PN junction diode device which exhibits a nonlinear voltage in response to linear current conduction, an amplifier transistor, and a common current source for the transistor and diode device. The bias circuit responds to an input variable gain control voltage for causing the diode device to conduct current which varies linearly with the gain control voltage. First and second mutually differential control voltages are derived from the transistor and diode device, including a non-linearly varying voltage exhibited by the diode device. The derived voltages are applied to the differential amplifier for controlling the differential amplifier gain linearly with respect to the input gain control voltage.

Figure 1:
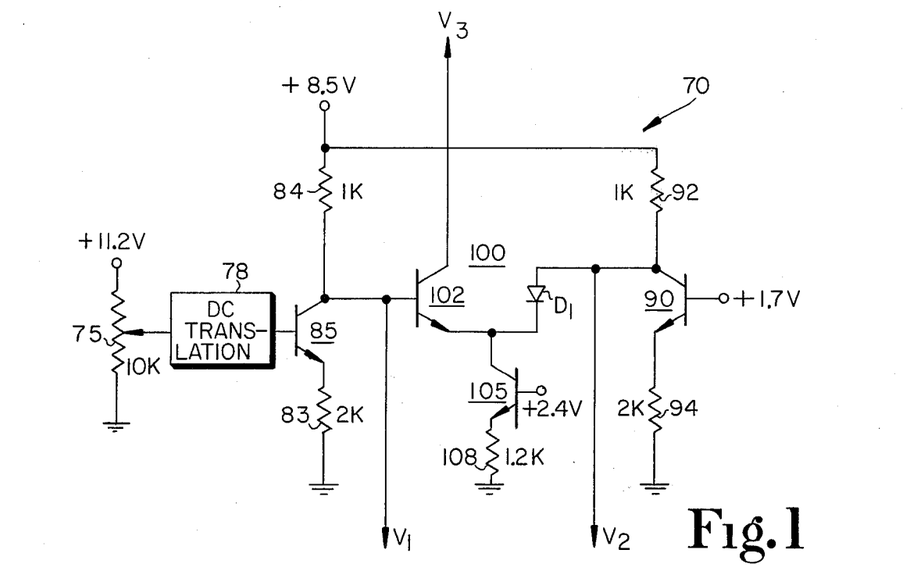
FIG. 1 shows a preferred form of a gain control signal translating circuit according to the present invention.

In FIG. 1, a variable gain control voltage is derived form the wiper of a potentiometer 75. The gain control voltage is DC coupled to the base control input of a controllable current source transistor 85 via a linear DC translation network 78. Network 78 cooperates with the circuit including transistor 85 and emitter and collector resistors 83 and 84 of transistor 85 such that the collector current and voltage of transistor 85 are caused to vary linearly with the gain control voltage from the wiper of potentiometer 75 as control 75 is adjusted between its extreme settings. Accordingly, the current through and the voltage drop across resistor 84 vary linearly with the gain control voltage.

Circuit 70 also includes a constant current source transistor 90 with associated collector and emitter resistors 92 and 94. This network is identical to the network including transistor 85 and resistors 83 and 84, and both networks are coupled to the same operating supply potential between +8.5 volts and ground.

Circuit 70 further includes a current splitter network 100 comprising a transistor 102, a diode $D_1$ and a current source comprising a transistor 105 and a resistor 108. Operating current supplied by transistor 105 splits between transistor 102 and diode $D_1$ as a function of the variable bias voltages developed across resistors 84 and 92 as will be discussed.

As mentioned previously, the collector voltage of transistor 85 and thereby the voltage drop across resistor 84, as well as the base voltage of transistor 102, vary linearly with respect to the gain control voltage from control 75. The anode voltage of diode $D_1$ and the voltage drop across resistor 92 also vary by substantially the same amount, except for a fixed offset voltage which is very small compared to the variable voltage drops across resistors 84 and 92, as will be discussed. The emitter voltage of transistor 102 and the cathode voltage of diode $D_1$ are one junction voltage drop ($1V_{BE}$, or approximately 0.7 volts) less than the base voltage of transistor 102. The anode voltage of diode $D_1$ is $1V_{BE}$ greater than the cathode voltage of diode $D_1$, whereby the base of transistor 102 and the anode of diode $D_1$ very linearly together (along with the voltage drops across resistors 84 and 92) with respect to control 75.

The current conducted by resistor 92 includes a variable component which varies linearly with control 75, and a constant current component attributable to constant current source transistor 90. In this example the voltage drops across resistors 84 and 92 respectively vary linearly relative to control 75 by approximately 1.5 volts (i.e., ±0.75 volts) and 1.4 volts (i.e., ±0.7 volts) as control 75 is adjusted between maximum and minimum gain control voltage levels. The base voltage of transistor 102 and the anode voltage of diode $D_1$ are substantially equal when control 75 is set at the midpoint of its control range. When control 75 is at one extreme position (ground potential), transistor 85 is non-conductive and the base of transistor 102 is at the operating supply potential (+8.5 volts). To assure that all of the current from source 105 then flows in transistor 102, it is necessary to develop a differential voltage offset between the anode of diode $D_1$ and the base of transistor 102. This is accomplished by the DC voltage drop then developed across resistor 92 in response to the constant current supplied by current source transistor 90. When control 75 is set at the other extreme position (+11.2 volts), transistor 85 conducts heavily and all of the current from source 105 is conducted by diode $D_1$ and flows in resistor 92. In this case, the voltage drop across resistor 84 (developed in response to the collector current of transistor 85) substantially equals the voltage drop across resistor 92 (developed in response to the total current from source 105 plus the constant current supplied by source 90).

Semiconductor diode $D_1$ (a PN junction) exhibits a non-linear transfer characteristic. Since diode $D_1$ conducts a current linearly related to the setting of control 75 as described, a non-linear voltage component is developed across diode $D_1$ in accordance with this current.

Translated gain control voltages $V_1$ and $V_2$ are respectively derived from the voltages developed at the base electrode of transistor 102 and the anode of diode $D_1$. The collector voltage of transistor 85, and thereby the base voltage of transistor 102 and translated control voltage $V_1$, vary linearly with the gain control voltage developed at the wiper of control 75. The anode voltage of diode $D_1$ and thereby translated control voltage $V_2$ include a component which varies linearly with control 75, and also include a non-linear component as a consequence of the non-linear voltage developed across diode $D_1$. Accordingly, when differential control voltage $V_1-V_2$ is applied across the gain control base input electrodes of a gain controlled differential amplifier, the differential amplifier is caused to conduct linearly with respect to the gain control voltage from control 75. That is, differential gain control voltage $(V_1-V_2)$ exhibits a non-linearity which compensates for the otherwise inherent non-linear conduction characteristic of the gain controlled differential amplifier. Additional details concerning this result will be disclosed with regard to FIGS. 3, 4 and 5.

It is also noted that a DC compensation voltage $V_3$ derived from the collector output of transistor 102 can be coupled to the gain controlled differential amplifier for maintaining the quiescent DC output potential of the gain controlled amplifier substantially constant as the amplifier is gain controlled. This feature will also be discussed in greater detail with regard to FIG. 3.

Figure 2:
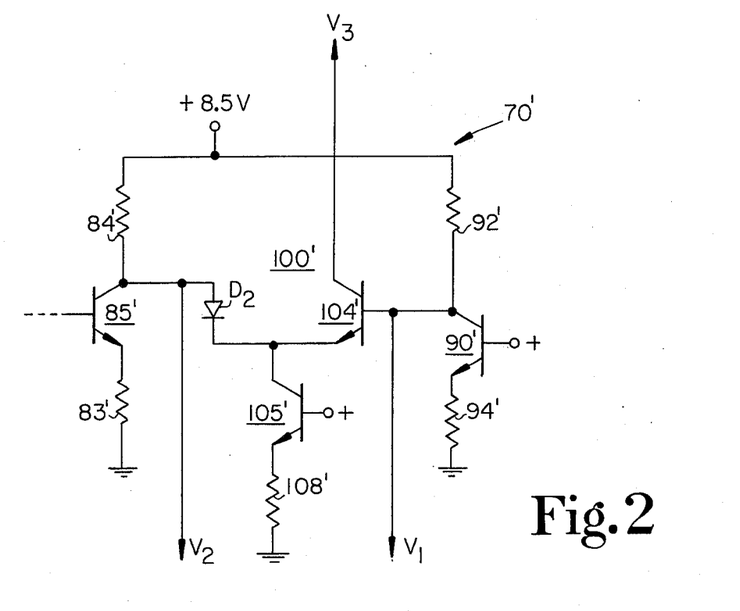
FIG. 2 shows a modified form of the signal translating circuit of FIG. 1.

FIG. 2 depicts another version of translating network 70. In FIG. 2, translating network 70' includes a controlled conduction current source transistor 85' with associated collector and emitter resistors 84' and 83', and a constant current source transistor 90' with associated collector and emitter resistors 92' and 94'. As in the case of transistor 85 in FIG. 1, transistor 85' responds to an appropriately translated version of the gain control voltage from control 75 such that the collector voltage and collector current of transistor 85' vary linearly with control 75. Accordingly, the current flowing in and the voltage across resistor 84' also vary linearly with control 75.

The circuits comprising elements 85', 83', 84' and elements 90', 92', 94' are coupled across the same operating potential (between +8.5 volts and ground). In a preferred embodiment, transistors 85' and 90' exhibit similar conduction characteristics, resistors 83' and 94' are of equal value, and resistors 84' and 92' are of equal value. The collector voltage of transistor 90' is fixed, whereby the base voltage of transistor 104' is also fixed.

Circuit 70' also comprises a current divider network 100' including a diode $D_2$ and a transistor 104'. Operating currents for the current divider network are provided by means of a current source including a transistor 105' and a resistor 108'.

In FIG. 2 the voltage drop across resistor 92' (the product of the value of resistor 92' and the constant current from transistor 90') is significantly greater than the difference between translated gain control voltages $V_1$ and $V_2$ which are derived as discussed below. Transistor 85' is biased by the control source to conduct a varying current. This current varies from substantially zero current at one extreme setting of the control source, to a maximum current substantially equal to the amount of current supplied by source 105' at the other extreme setting of control 75. In the former instance, all of current from source 105' flows through diode $D_2$ and resistor 84', while in the latter case all of the current from source 105' flows in transistor 104'. As a result, increasing collector current of transistor 85' is compensated by a correspondingly decreasing current in diode $D_2$, and the potential at the junction the collector of transistor 85' and the anode of diode $D_2$ remains essentially constant. Illustratively, when the quiescent voltage drop across resistor 84' is on the order of three volts, a total voltage variation across resistor 84' of 100 millivolts (±50 millivolts) relative to the quiescent voltage drop of three volts corresponds to a total voltage variation of only 3%.

The current conducted by resistor 84' equals the sum of the current conducted by diode $D_2$ and the collector current of transistor 85'. The current in diode $D_2$ varies linearly with control 75 since the total current in resistor 84' is substantially constant and the variable collector current of transistor 85' varies linearly with control 75. In other words, the substantially constant total current flowing in resistor 84' minus the linear collector current component of transistor 85', produces a linear current flowing in diode $D_2$. The current in diode $D_2$ is oppositely phased relative to the collector current of transistor 85' such that the sum of the collector current of transistor 85' and the current in diode $D_2$ is substantially constant.

Since diode $D_2$ (which exhibits a non-linear conduction characteristic) conducts a linear current with respect to control 75, the voltage developed across diode $D_2$ is non-linear. A fixed gain control voltage $V_1$ is derived from the junction of the collector of transistor 90' and the base of transistor 104', and a variable gain control voltage $V_2$ is derived from the junction of the collector of transistor 85' and the anode of diode $D_2$. Voltage $V_2$ includes a fixed component corresponding to the voltage drop across resistor 84', and a non-linear component produced as a consequence of the non-linear voltage developed across diode $D_2$. When differential gain control voltage $V_1-V_2$ is applied to a gain controlled differential amplifier, the amplifier is caused to conduct linearly with respect to control 75 since the non-linear component of voltage $V_2$ compensates for the inherent non-linear transfer response of the gain controlled differential amplifier.

Figure 3:
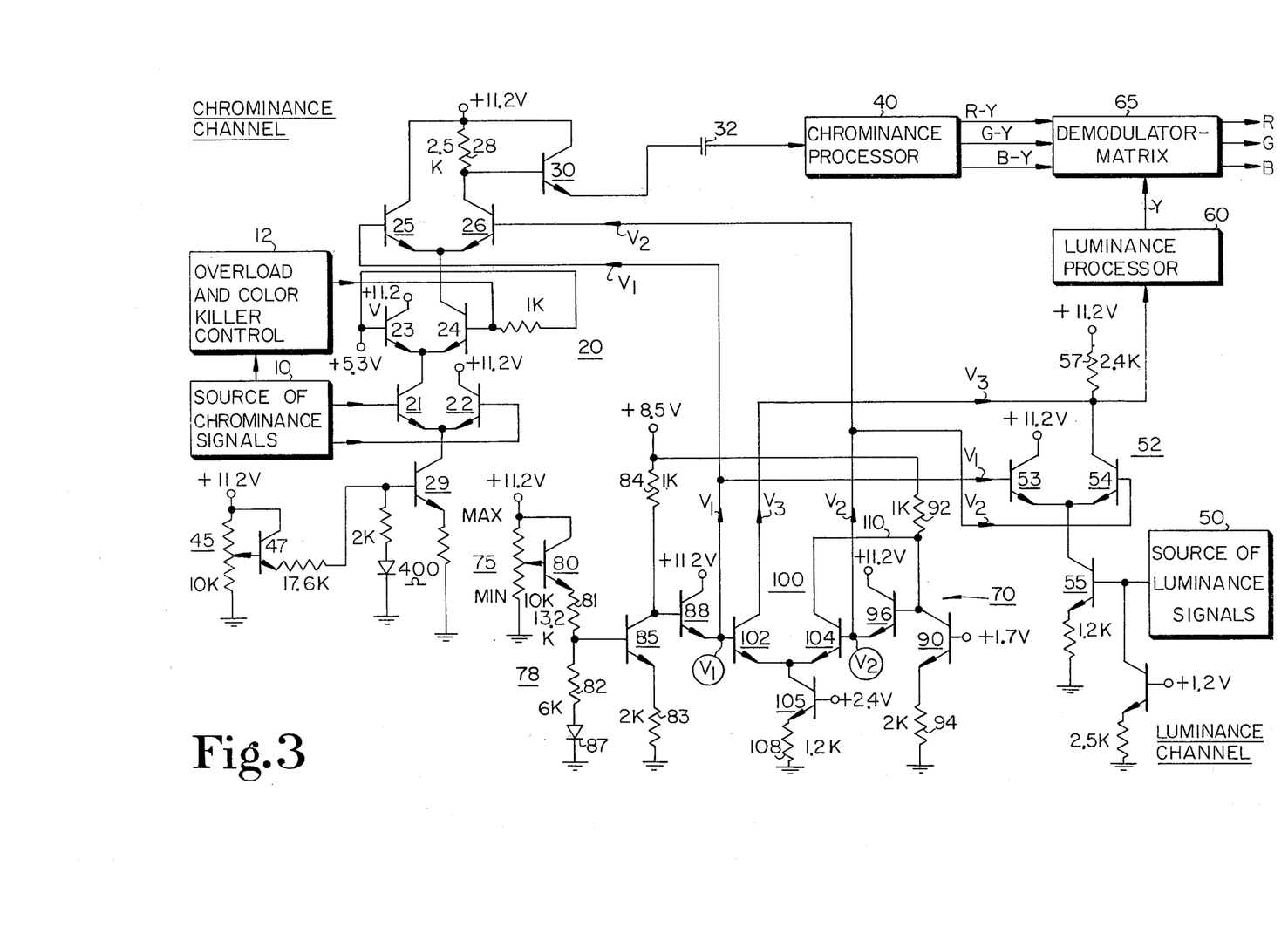
FIG. 3 shows a portion of a color television receiver, partly in block diagram form and partly in schematic circuit diagram form, including a gain control signal translating circuit of the type shown in FIG. 1.

FIG. 3 shows a portion of a color television receiver including a gain control signal translating circuit 70 of the type shown in FIG. 1.

In the color television receiver system of FIG. 3, the chrominance signal processing channel is shown as comprising a source of chrominance signals 10, a signal overload and color killer control network 12, a chrominance amplifier 20, and a chrominance signal processor 40.

Amplifier 20 comprises a multiple level differential amplifier arrangement including three stacked differential amplifiers. Complementary phase (i.e., push-pull) chrominance signals are supplied from source 10 to respective base inputs of a first level differential amplifier comprising emitter coupled transistors 21 and 22. Amplified chrominance signals from a collector output of transistor 21 are applied to the joined emitter electrodes of transistors 23 and 24, which form a second level differential control stage. Further amplified chrominance signals from the collector output of transistor 24 are applied to the joined emitters of transistors 25 and 26, which form a third level differential amplifier control stage. Finally amplified chrominance signals appear across a load impedance 28 in the collector output circuit of transistor 26. These signals are coupled via an emitter follower transistor 30 and an AC coupling capacitor 32 to chrominance processor 40 for developing R-Y, G-Y and B-Y color difference signals. Operating currents for amplifier circuit 20 are provided by a current source including a transistor 29.

Amplifier circuit 10 is gain controlled by means of three independently derived gain control voltages. The overall gain of amplifier 20 is accomplished in response to a control voltage derived from a potentiometer 45 which serves as a viewer adjustable chrominance saturation control. A variable control voltage derived from the wiper of potentiometer 45 is coupled via an emitter follower transistor 47 to a base input of current source transistor 29, for varying the current conduction of transistor 29 and thereby the signal gain of the first, second and third level differential amplifiers.

The second and third level differential amplifiers 23, 24 and 25, 26 are additionally gain controlled in response to an overload and color killer control signal applied from network 12 to the base input of transistor 24. Control network 12 is of conventional design and responds to the level of chrominance signals (e.g., from source 10) for reducing the amplifier of chrominance output signals from circuit 20 under conditions of excessively high level chrominance signals (in an overload control mode) and for inhibiting the chrominance signals under conditions of excessively weak chrominance signals (in a color killer mode).

Third level differential amplifier 25, 26 is also gain controlled in response to differential control voltages $V_1$ and $V_2$ respectively applied to the base electrodes of transistors 25 and 26, for providing color saturation control independent of the gain control mechanisms already discussed.

The luminance channel of the receiver comprises a source of luminance signals 50, a luminance amplifier 52, and a luminance processor 60. Amplified luminance signals Y from processor 60 are combined in a matrix amplifier 65 with the color difference signals from processor 40 to develop output color representative signals R, G and B. These signals are ultimately supplied to a color kinescope of the receiver for producing a color image.

Luminance amplifier 52 comprises a differential amplifier including differentially connected transistors 53, 54 and an associated current source transistor 55. Input luminance signals are applied to the base of transistor 55, and amplified output luminance signals are developed across an impedance 57 in the collector output circuit of transistor 54. Amplifier 52 is also gain controlled in response to control voltages $V_1$ and $V_2$ respectively applied to the base electrodes of transistors 53 and 54. In addition, a DC compensation voltage $V_3$ is applied to the collector output circuit of transistor 54.

Differential amplifier control voltages $V_1$, $V_2$ and DC compensation voltage $V_3$ are provided by a network including a viewer adjustable gain control potentiometer 75 and a gain control signal translating circuit 70, and are DC coupled to chrominance differential amplifier 25, 26 and to luminance differential amplifier 53, 54. Control 75 corresponds to a viewer adjustable control for simultaneously varying the (luminance) contrast and the (chrominance) saturation of a reproduced color image.

Base controlled differential amplifiers 25, 26 and 53, 54 exhibit a non-linear input-versus-output transfer response over most of the transistor conduction range between saturation and cut-off. Differential amplifiers 25, 26 and 53, 54 are intended to be gain controlled over much of the conduction range. Without linearity compensation, the controlled amplifiers would exhibit a pronounced non-linear transfer response as the extremes of the operating range are approached. In such case the conduction of amplifiers 25, 26 and 53, 54 and hence their gain would not be linearly proportional to the gain control voltage source (i.e., potentiometer 75) from which the differential base control voltages are derived. Differential gain control voltages $V_1$ and $V_2$ from translating circuit 70 serve to compensate for the otherwise non-linear response of amplifiers 25, 26 and 53, 54 such that these amplifiers exhibit a substantially linear gain control response over the intended wide differential amplifier conduction range.

Circuit 70 in FIG. 3 operates in the same manner as circuit 70 in FIG. 1. Corresponding elements in FIGS. 1 and 3 are identified by the same reference number. The DC translation network 78 in FIG. 1 corresponds to the network in FIG. 3 including emitter follower transistor 80, resistors 81 and 82, and a diode 87 coupled between the wiper of control potentiometer 75 and the base input of controlled current source transistor 85. A variable gain control voltage developed at the wiper of potentiometer 75, as potentiometer 75 is adjusted between maximum (MAX) and minimum (MIN) gain control settings, exhibits a level of +11.2 volts for maximum signal gain, and a level of approximately +2.0 volts for minimum signal gain. The minimum gain control level of +2.0 volts corresponds to the voltage appearing on the wiper of potentiometer 75 when current source transistor 85 is rendered non-conductive. The collector current and voltage of transistor 85 vary linearly with corresponding variations of the gain control voltage between the maximum and minimum gain control levels. A low output impedance emitter follower transistor 88 couples the collector output circuit of transistor 85 to the base of transistor 102, at which point gain control voltage $V_1$, corresponding to a DC translated version of the variable voltage from control 75, is developed (in the manner discussed with reference to FIG. 1).

Gain control voltage $V_2$ is developed at the base of transistor 104 in the same manner discussed with reference to FIG. 1, and includes a non-linear component such that when differential voltages ($V_1 - V_2$) is applied to amplifiers 25, 26 and 53, 54, these amplifiers are caused to exhibit linearly variable gain characteristic with respect to control 75.

It is noted that transistor 104 of current divider 100 is arranged in a diode-like configuration with collector and base electrodes being interconnected via conductor 110 and the base-emitter junction of voltage follower 96. Diode-connected transistor 104 in FIG. 3 corresponds to diode $D_1$ in FIG. 1, and operates in the same manner to produce the non-linear component discussed previously with respect to FIG. 1. The presence of voltage follower transistor 96 in the DC coupling between the collector and base electrodes of diode-connected transistor 104 does not upset the operation of the circuit and the manner in which the non-linear component of control voltage $V_2$ is developed.

It is also noted that voltage $V_3$ is derived from the collector output current of transistor 102, and is DC coupled to the collector output circuit of differential amplifier transistor 54. This connection advantageously serves to maintain the quiescent DC collector output voltage of transistor 54 substantially constant as differential amplifier 52 is gain controlled in response to control voltages $V_1$ and $V_2$. As control 75 is adjusted, the DC collector currents of transistors 102 and 54 vary substantially equally in magnitude but oppositely in direction. Thus the DC current through and voltage drop across load resistor 57 remain substantially constant as control 75 is adjusted, thereby facilitating the DC coupling of gain controlled output signals from transistor 54 to luminance processor 60.

Figure 4:
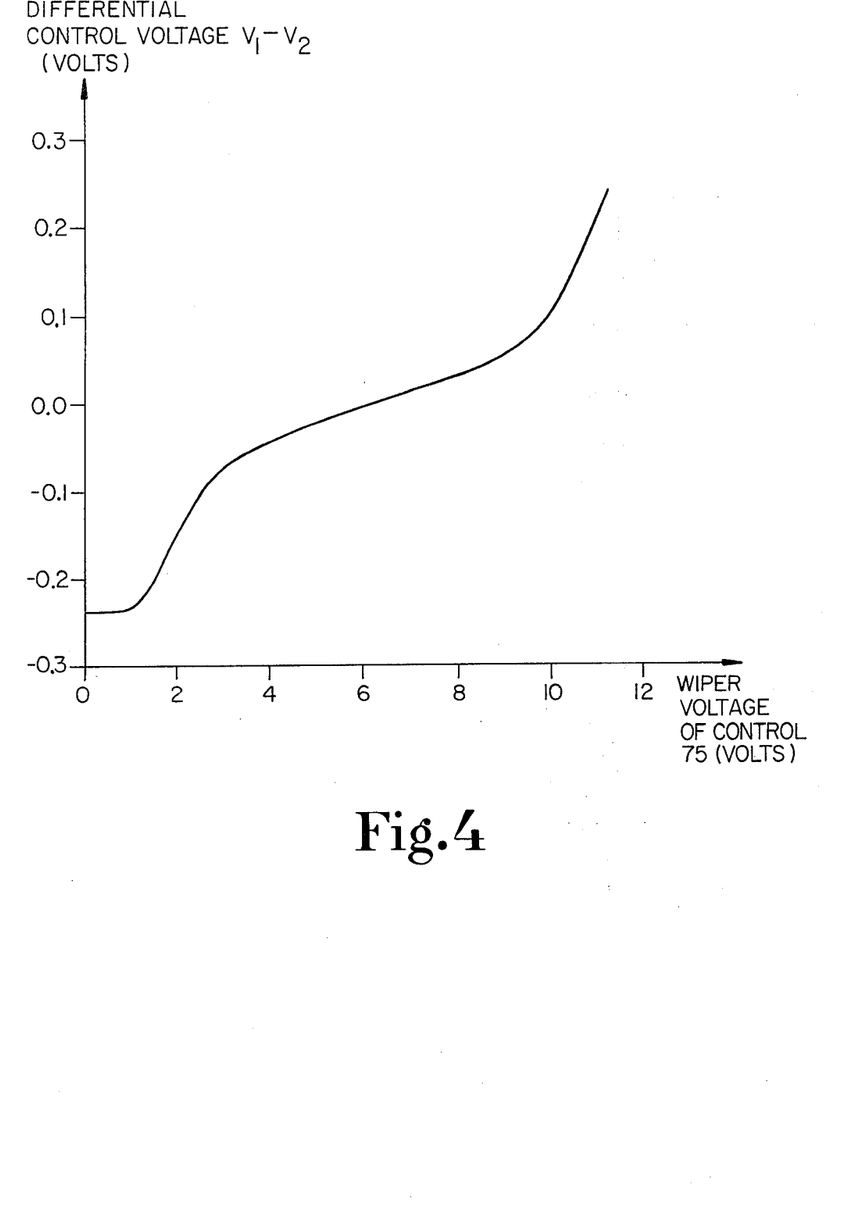
FIGS. 4 and 5 show signal transfer responses associated with the gain control arrangement of FIG. 3.
Figure 5:
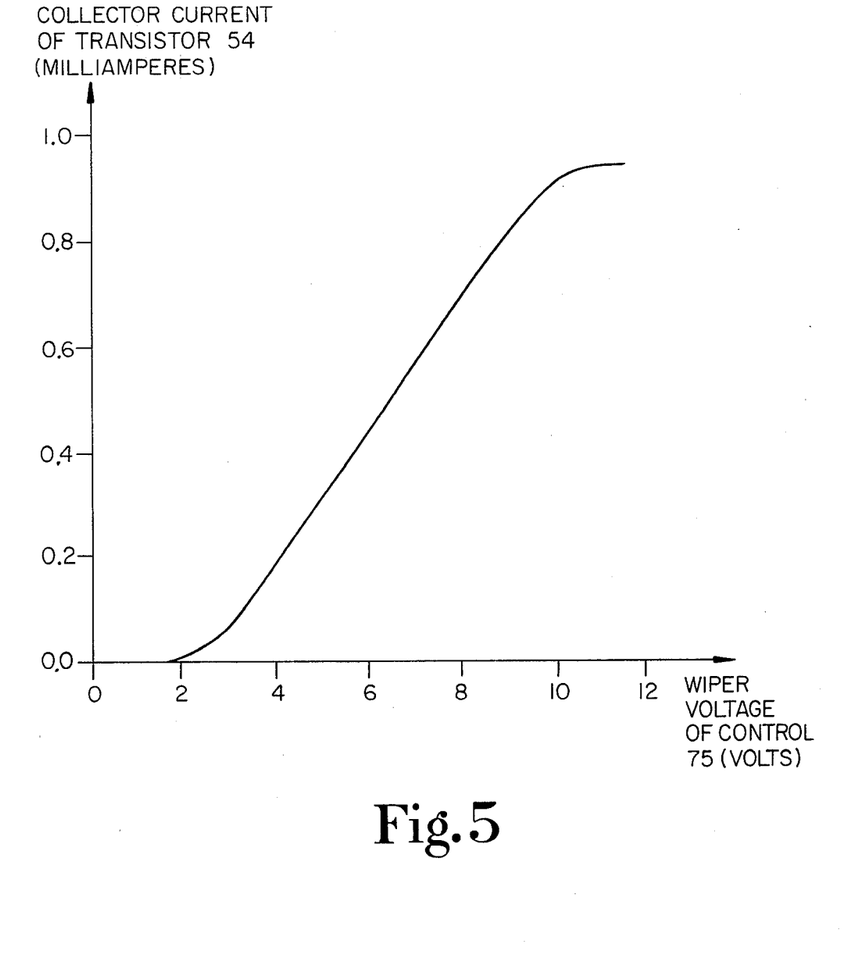

FIG. 4 depicts the non-linear characteristic of differential control voltage ($V_1 - V_2$) in response to the linear wiper voltage of control 75. FIG. 5 illustrates the linearly variable collector current of gain controlled amplifier transistor 54 in response to the linearly varying wiper voltage of control 75 over the gain control range.

Figure 6:
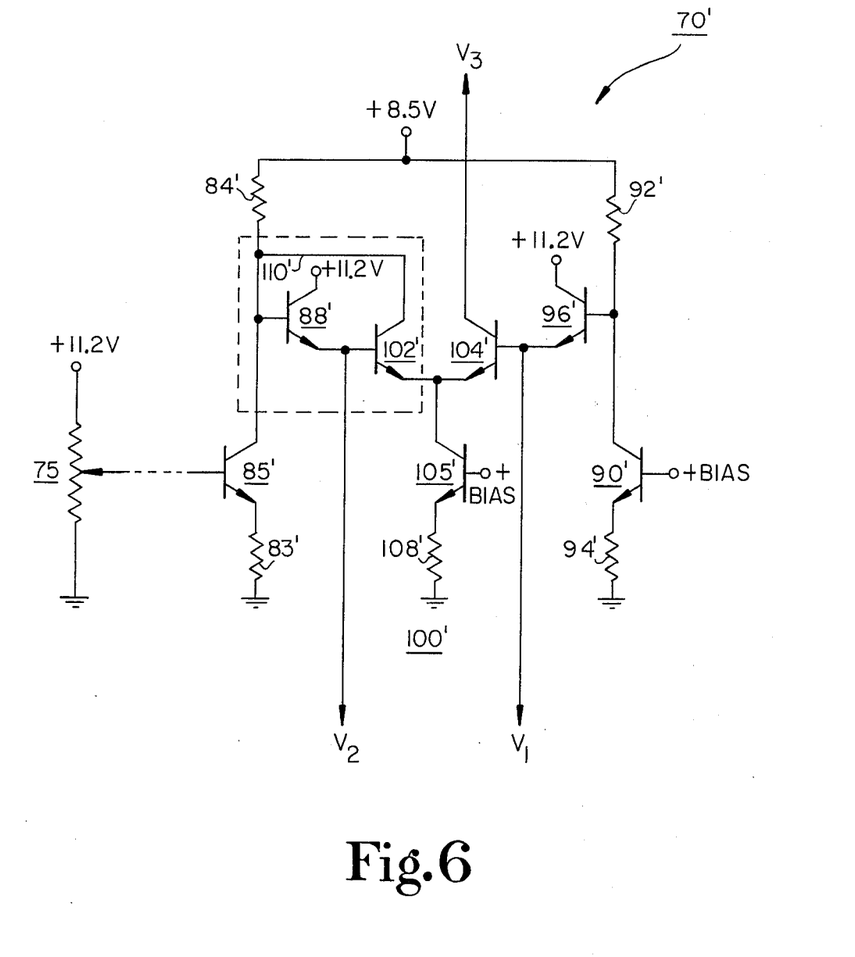
FIG. 6 shows a gain control signal translating circuit of the type shown in FIG. 2, suitable for use in the color television receiver system of FIG. 3.

FIG. 6 shows a gain control signal translating circuit 70' of the type shown in FIG. 2 (wherein corresponding elements are identified by the same reference number), and which is suitable for use in the television receiver system of FIG. 3 (i.e., as a replacement for circuit 70 of FIG. 3).

Comparing circuits 70' in FIGS. 2 and 6, it is noted that circuit 70' in FIG. 6 additionally includes emitter follower transistors 88' and 96' respectively coupled from transistors 85' to 102' and from transistors 90' to 104'. Transistor 102' is arranged in a diode connected transistor configuration with base and collector electrodes interconnected by means of a conductor 110' and follower transistor 88'. Diode-connected transistor 102' in FIG. 6 functionally corresponds to diode $D_2$ in FIG. 2, for the purpose of generating the non-linear component of voltage $V_2$ of differential control voltage ($V_2 - V_1$). The generation of the non-linear component by diode-connected transistor 102' is not impaired by the presence of voltage follower transistor 88' in the collector-to-base coupling of transistor 102'.

In FIG. 6 differential control voltages $V_1$ and $V_2$ are respectively derived from transistors 104' and 102' (rather than from the base electrodes of transistors 102 and 104, respectively, as shown in FIG. 3) to maintain the proper sense for DC compensation when voltage $V_3$ is coupled from the collector of transistor 104' to the collector output circuit of transistor 54 in FIG. 3.

The arrangement of FIGS. 2 and 6, wherein the differential gain control voltage ($V_1 - V_2$) varies a very small amount ($\pm 50$ millivolts) and wherein the absolute values of voltages $V_1$ and $V_2$ remain essentially constant, is advantageously used when the gain controlled differential amplifier operates with restricted bias requirements, such as when the differential gain control bias voltage is constrained to within a certain narrow limit relative to the overall operating supply voltage range. This condition is likely to exist with a stacked differential amplifier arrangement such as circuit 20 in FIG. 3 (wherein the bias of each differential amplifier level consumes a portion of the overall operating supply range), although such a condition does not exist for the particular version of circuit 20 shown.

The mutual symmetry of network 85, 83, 84 and network 90, 92, 94 which bias current divider circuit 100 (FIGS. 1 and 3) advantageously prevents the operation of current divider 100 from being impaired by variations of the +8.5 volt supply, or by interfering signals which may appear on the operating supply terminals (+8.5 volts and ground) due to stray signals originating elsewhere in the system. The latter is especially likely to occur in an integrated circuit environment due to stray signal coupling through the ground reference potential substrate semiconductor material, for example. The symmetrical configuration of these networks causes such supply variations and interfering signals to be coupled to network 100 with equal magnitude, and have no effect on the operation of network 100 due to the common mode signal rejection capability of network 100.

The use of differential control voltages $V_1$ and $V_2$ is advantageous in that any such supply variations and interfering signals which do appear in common at the base electrodes of transistors 102 and 104 (FIG. 3), or at the base of transistor 102 and the anode of diode $D_1$ (FIG. 1), do not affect the differential control voltage $V_1 - V_2$, and are rejected by the common mode rejection characteristic of the gain controlled differential amplifier.

The use of differential control voltages $V_1$ and $V_2$ is also advantageous in that more than one differential amplifier can be controlled without concern for the adverse effects of loading by the controlled differential amplifiers upon circuit 100. For example, in the system of FIG. 3 the input of transistor 102 is loaded by the base currents of both controlled transistors 25 and 53, and the input of diode-connected transistor 104 is loaded by the base currents of both controlled transistors 26 and 54. However, the desired balanced operation of network 100 is not impaired since the gain controlled amplifiers load differential network 100 symmetrically.

The advantages noted above apply to both gain control signal translating circuits 70 (FIGS. 1 and 3) and 70' (FIGS. 2 and 6), which can be used to translate an alternating current signal rather than a variable DC gain control voltage derived from a control potentiometer as discussed.

What is claimed is:

1. Apparatus for controlling the gain of a differential amplifier having first and second control inputs, comprising:
   a first source of supply potential;
   a second source of supply potential;

a current steering network including
(a) a first transistor having a control electrode for controlling the current conducted in the main current conduction path of said first transistor;
(b) a semiconductor junction; and
(c) a source of predetermined current coupled to said current path of said first transistor and to said semiconductor junction for supplying current thereto;

first means for controlling the conduction of said first transistor current path, comprising
(a) a second transistor having a control electrode for controlling the conduction of the main current conduction path of said second transistor;
(b) first and second impedances; and wherein
(c) said first impedance, said conduction path of said second transistor, and said second impedance are connected in series in the order named, between said first and second sources of potential;

second means for controlling the conduction of said semiconductor junction, comprising
(a) a third transistor having a control electrode for controlling the conduction of the main current conduction path of said third transistor;
(b) third and fourth impedances; and wherein
(c) said third impedance, said conduction path of said third transistor, and said fourth impedance are connected in series in the order named, between said first and second sources of potential;

means for generating a variable voltage;
means for coupling said variable voltage to the control electrode of one of said second and third transistors;
means for coupling a substantially fixed DC voltage to the control electrode of the other one of said second and third transistors;
means for coupling a voltage developed by said first impedance to said control electrode of said first transistor at a first point;
means for coupling a voltage developed by said third impedance to said semiconductor junction at a second point, for developing a current through said semiconductor junction which varies substantially linearly as a function of said variable voltage; and
means for coupling voltages derived from said first and second points to said first and second control inputs of said differential amplifier, respectively.

2. Apparatus according to claim 1, wherein
said semiconductor junction corresponds to a diode-connected transistor with interconnected collector and base electrodes.

3. Apparatus according to claim 1, wherein
said variable voltage is coupled to the base of said second transistor; and wherein
currents conducted by said first and third impedances vary linearly in the same sense and with substantially the same magnitude, as a function of said variable voltage.

4. Apparatus according to claims 1 or 3, wherein
said first and third impedances are substantially equal in value.

5. Apparatus according to claim 4, wherein
said second and fourth impedances are substantially equal in value.

6. Apparatus according to claim 1, and further comprising
means for DC coupling said main current conduction path of said first transistor to said gain controlled differential amplifier with a sense for maintaining the quiescent output current of said differential amplifier substantially constant as the gain of said differential amplifier is varied in response to said derived first and second voltages.

7. Apparatus according to claim 1, wherein
said means for coupling said voltage developed by said first impedance to said first transistor at said first point comprises an emitter follower transistor; and
said means for coupling said voltage developed by said third impedance to said semiconductor junction at said second point comprises an emitter follower transistor.

8. Apparatus according to claim 1, wherein
said variable voltage is coupled to the base of said third transistor.

9. Apparatus according to claim 8, wherein
said first and third impedances are substantially equal in value; and
said second and fourth impedances are substantially equal in value.

* * * * *